United States Patent
Shen et al.

(10) Patent No.: US 7,652,905 B2
(45) Date of Patent: Jan. 26, 2010

(54) FLASH MEMORY ARRAY ARCHITECTURE

(75) Inventors: Jian-Yuan Shen, Taichung (TW); Chi-Ling Chu, Taichung County (TW); Chou-Ying Yang, Changhua County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 19 days.

(21) Appl. No.: 11/969,812

(22) Filed: Jan. 4, 2008

(65) Prior Publication Data

US 2008/0165584 A1    Jul. 10, 2008

Related U.S. Application Data

(60) Provisional application No. 60/878,775, filed on Jan. 4, 2007.

(51) Int. Cl.
*G11C 5/06* (2006.01)

(52) U.S. Cl. .............. 365/63; 365/185.11; 365/185.05; 365/185.33

(58) Field of Classification Search ............ 365/63, 365/185.11, 185.05, 185.33
See application file for complete search history.

(56) References Cited

U.S. PATENT DOCUMENTS

| | | | | |
|---|---|---|---|---|
| 4,918,662 A | * | 4/1990 | Kondo | 365/230.06 |
| 5,555,212 A | * | 9/1996 | Toshiaki et al. | 365/200 |
| 5,617,364 A | * | 4/1997 | Hatakeyama | 365/200 |
| 5,808,944 A | * | 9/1998 | Yoshitake et al. | 365/200 |
| 6,134,142 A | * | 10/2000 | Hirano | 365/185.09 |
| 6,208,570 B1 | * | 3/2001 | Brown et al. | 365/201 |
| 6,246,617 B1 | * | 6/2001 | Urakawa | 365/200 |
| 6,324,105 B1 | * | 11/2001 | Shirley | 365/200 |
| 6,397,313 B1 | * | 5/2002 | Kasa et al. | 711/168 |
| 6,490,201 B2 | * | 12/2002 | Sakamoto | 365/185.22 |
| 6,563,743 B2 | * | 5/2003 | Hanzawa et al. | 365/189.02 |
| 6,762,963 B2 | * | 7/2004 | Inoue et al. | 365/200 |
| 6,845,029 B2 | | 1/2005 | Santin et al. | |
| 6,950,352 B1 | * | 9/2005 | Jung et al. | 365/200 |
| 6,966,012 B1 | * | 11/2005 | Gandhi | 714/7 |
| 7,145,816 B2 | * | 12/2006 | Abedifard | 365/200 |
| 7,362,644 B2 | * | 4/2008 | Yang et al. | 365/225.5 |
| 7,388,782 B2 | * | 6/2008 | Tokiwa | 365/185.09 |

* cited by examiner

*Primary Examiner*—Viet Q Nguyen
(74) *Attorney, Agent, or Firm*—Jianq Chyun IP Office

(57) ABSTRACT

A memory device comprises a memory array of memory cells for storing data and an information array of information cells for storing operating information. The information array is coupled to the memory array so that the information array and the memory array share the same data path circuitry for reading, erase or programming operations. A power-on control circuit controls the operation of the information array.

20 Claims, 4 Drawing Sheets

FLASH MEMORY ARRAY ARCHITECTURE

CROSS-REFERENCE TO RELATED APPLICATIONS

This application claims the benefit of U.S. Provisional Application No. 60/878,775, filed on Jan. 4, 2007, and is herein incorporated by reference in its entirety.

DESCRIPTION OF THE INVENTION

1. Field of the Invention

The present invention relates generally to a memory device and, more particularly, to a flash memory array architecture.

2. Background of the Invention

Two main types of memory devices may be used in the field of data storage. The first type is volatile memory where the information stored in memory cells is lost when the instant power is removed. The other type is non-volatile memory in which the information stored in the memory cells is preserved even with the power removed. Flash memory is a type of non-volatile memory, which allows for high memory densities, high reliability and low power consumption.

Flash memory may include a main memory array comprising a number of non-volatile memory cells for data storage. Additionally, a memory system having a flash memory may also include a fuse system for storing information and parameters related to or necessary for the operation of the flash memory. As an example. the information and parameters may include configuration data, chip identification data, trimming data, and redundancy data. The information and parameters may be read into a general-purpose bus during the initialization phrase (i.e., power-on) and subsequently loaded into a register in the flash memory device.

Generally, a fuse system operates independently from a main memory array. The fuse system may include a number of fuse circuits, each of which may include a cell for storing information or parameters, a register, and a data path between the cell and the register including decoders, sensing circuits and data buffers. When a large amount of information is stored in the fuse system, the size of the fuse system area increases. In some applications, the architecture may occury a significant amount of silicon area and/or affect the operation or overall performance of the flash memory.

SUMMARY OF THE INVENTION

One example of the invention provides a memory device which comprises a memory array of memory cells for storing data and an information array of information cells for storing operating information. The information array is coupled to the memory array so that the information array and the memory array share the same data path circuitry for programming, erase or reading operations. A power-on control circuit controls the operation of the information array.

Another example of the invention provides a memory device which comprises a memory array of memory cells for storing data and an information array of information cells for storing operating information. The information array is coupled to the memory array so that the information array and the memory array share the same data path circuitry for programming, erase or reading operations. A power-on control circuit controls operation of the information array including reading the operating information from the information array and storing the operating information to an information register.

Still another example of the invention provides a method of operating a memory device which comprises steps of providing a memory array having a number of memory cells for storing data, providing an information array having a number of information cells for storing operating information, sharing a data path circuit between the memory array and the information array, and providing a control circuit for controlling the operation of the memory array and the information array.

It is to be understood that both the foregoing general description and the following detailed description are exemplary and explanatory only and are not restrictive of the invention, as claimed.

BRIEF DESCRIPTION OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1:
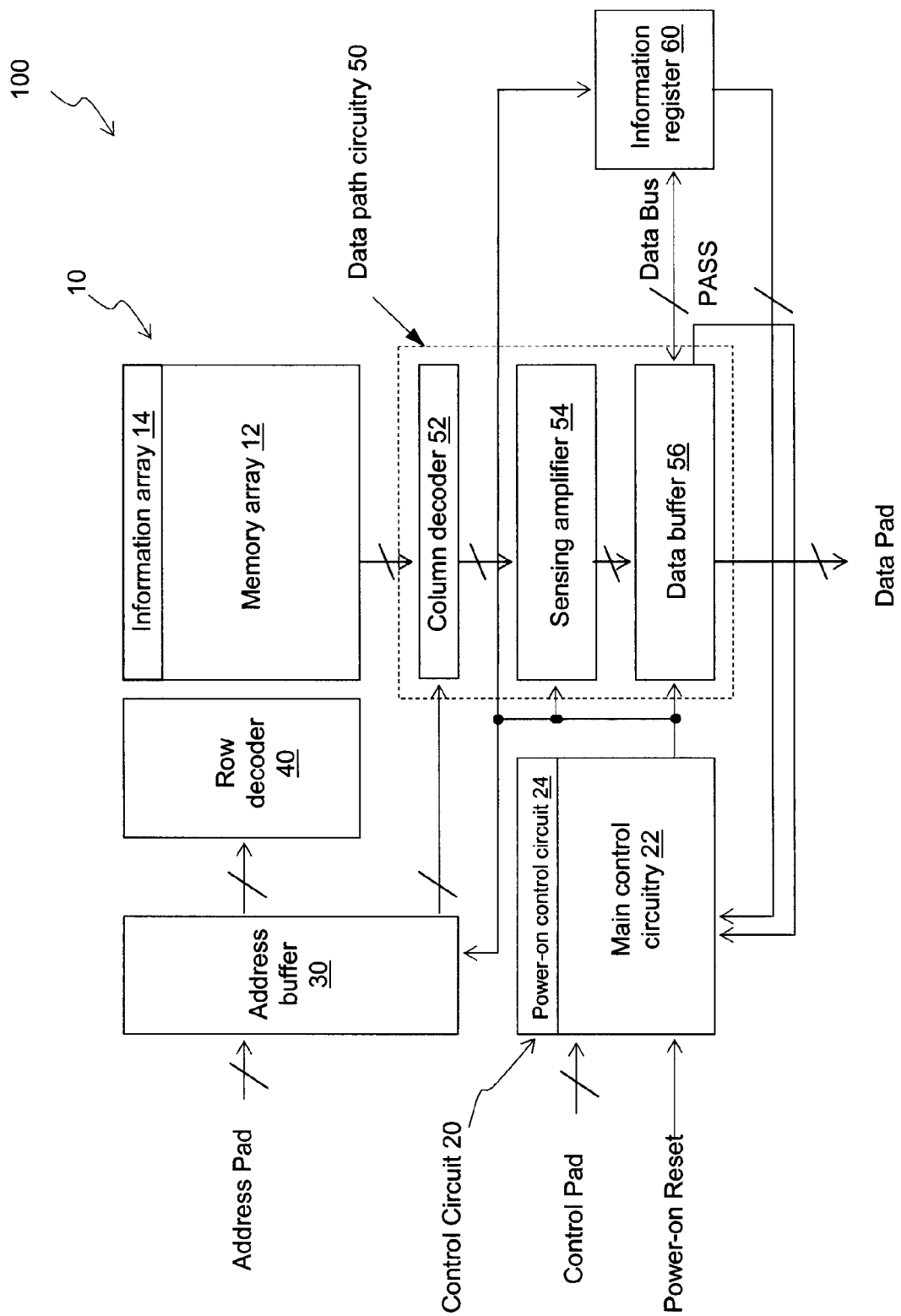
FIG. 1 is an exemplary block diagram of a memory device according to the present invention.

FIG. 1 illustrates an exemplary block diagram of a memory device 100, such as a flash memory device in examples consistent with the invention. The memory device 100 may include a main array of cells 10, control circuit 20, address buffer 30, row decoder 40, data path circuitry 50, and information register 60.

Figure 2:
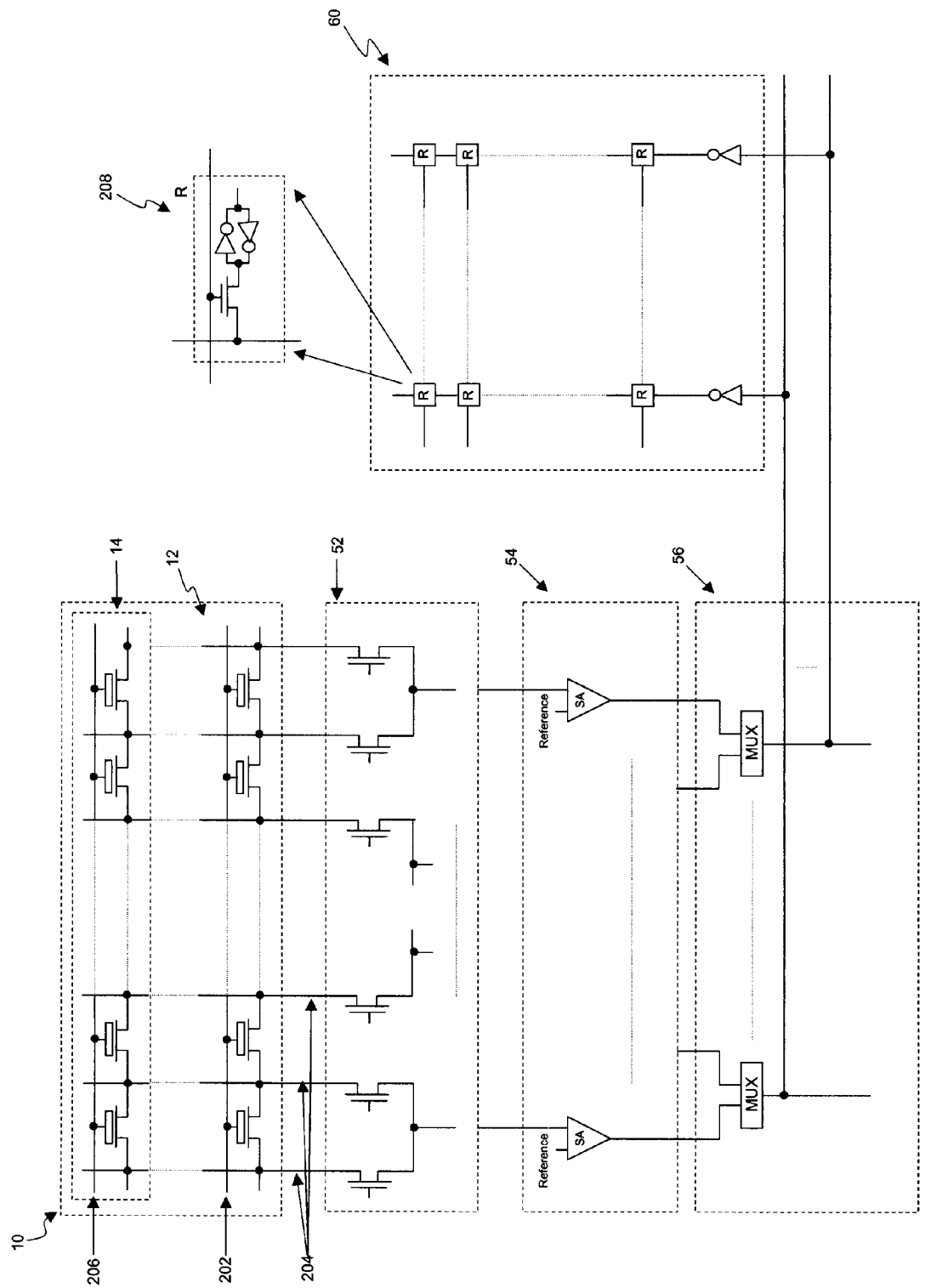
FIG. 2 is an exemplary circuit diagram of portion of the memory device of FIG. 1.

FIG. 2 illustrates an exemplary circuit diagram of portion of the memory device 100. Referring to FIGS. 1 and 2, the main array 10 may include memory array 12 and information array 14. The memory array 12 may include a number of memory cells, such as floating-gate memory cells, that may be arranged in rows and columns. The gate terminals of the memory cells in the same row may be coupled via one of word lines 202 while the source and drain terminals of the memory cells in the same column may be coupled via one of bit lines 204. The memory cells in the memory array 12 may be provided for data storage. The information array 14 may include a number of floating-gate information cells which are coupled to each other via a word line 206. The information cells may be coupled to the memory cells via the corresponding bit lines 204 as shown in FIG. 2. The information cells may be provided for storage of operating information including configuration data, chip identification data, trimming data, and redundancy data. By coupling to the same bit lines with the memory cells, the information cells may share the same data path circuitry 50 with the memory cells for programming, erase or reading operations.

Figure 3:
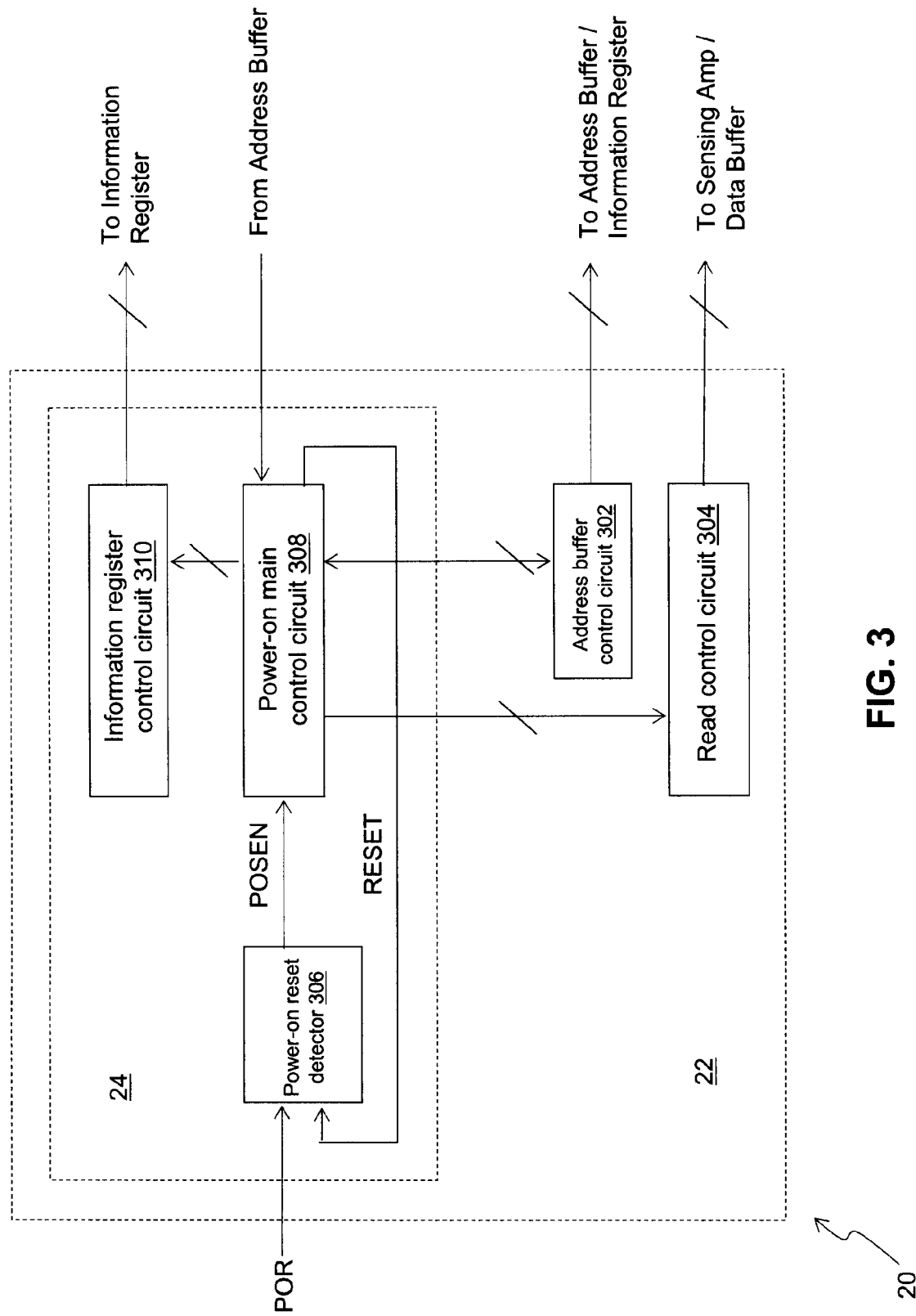
FIG. 3 is an exemplary block diagram of a control circuit in accordance with the example of the invention.

The control circuit 20 may be coupled to the main array 10 via the data path circuitry 50. FIG. 3 is an exemplary block diagram of the control circuit 20. Referring to FIGS. 1 and 3, the control circuit 20 may include main control circuit 22 and power-on control circuit 24. With respect to the main control circuit 22, it may include at least address buffer control circuit 302 and read control circuit 304. The address buffer control circuit 302 may provide an address control signal for the address buffer 30. The read control circuit 304 may generate a read control signal for controlling the reading operation of either the memory cells or the information cells. With respect to the power-on control circuit 24, it may include power-on reset detector 306, power-on main control circuit 308, and information register control circuit 310. The power-on reset detector 306 may be provided for detecting whether the power-on reset process is completed. The power-on main control circuit 308 is coupled to the power-on detector 306, the address buffer control circuit 302 as well as the read control circuit 304. The power-on main control circuit 308 may provide control information to the address buffer control circuit 302, read control circuit 304 and information register control circuit 310. The information register control circuit 310 coupled to the power-on main control circuit 308 may control loading of the operating information from the information cells to the information register 60.

The address buffer 30 coupled to the control circuit 20 may provide address signals to the row decoders 40 and column decoders 52 of the data path circuit 50 for decoding. The row decoders 40 may include a number of decoders, such as 16 decoders in one example, to decode the address signals received from the address buffer 30.

The data path circuitry 50 may be coupled to the main array 10, the control circuit 20 as well as the address buffer 30. The data path circuitry 50 may include a number of column decoders 52, sensing amplifiers 54 and data buffers 56. The column decoders 52 are coupled to the address buffer 30 and the main array 10. Each of the column decoders 52 may be provided to decode the address signals received from the address buffer 30, and select and access one or more columns of the memory array 12 or the information array 14 based on the decoded signals. The sensing amplifiers 54 coupled to the column decoders 52 may be provided to sense and amplify the data of the memory cells or operating information of the information cells selected by the column decoders 52. The data buffers 56 coupled to the sensing amplifiers 54 may be provided to store data or operating information derived from the sensing amplifiers 54.

The information register 60 may include a number of random access cells 208, such as SRAM in one example, arranged in rows and columns, for storing information. The information register 60 may be coupled to the data buffers 56 through a data bus, such as a 16 bit data bus, to receive the operating information from the data buffers 56 and store the operating information in the register cells.

Figure 4:
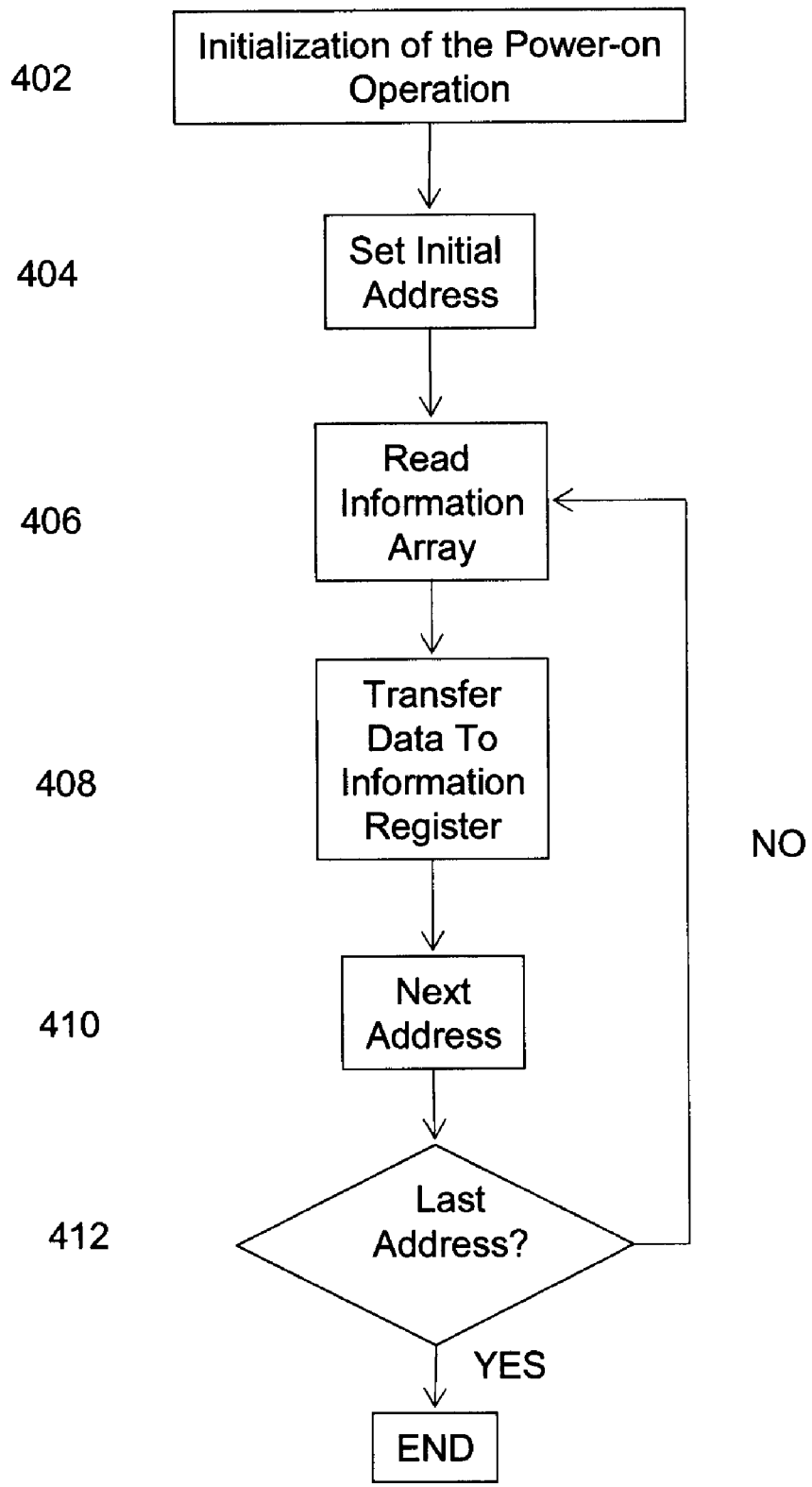
FIG. 4 is a flow chart showing the initialization operation of the memory device of FIG. 1 in accordance with the example of the invention.

FIG. 4 provides a flow chart showing the initialization operation of the memory device 100. In Step 402, a power-on reset signal is first applied to the power-on detector 306. Upon detecting the completion of the power-on reset process, the power-on detector 306 issues a signal POSEN to the power-on main control circuit 308 for initializing the operation of the power-on control circuit 22. In Step 404, the power-on main control circuit 308 provides the address buffer control circuit 302 with the control information concerning the initial address to be read from the information array 14. In Step 406, the address buffer control circuit 302, based on the control information from the power-on main control circuit 308, outputs address signals to the address buffer 30 which subsequently provides the address signals to the row decoders 40 and column decoders 52 for decoding to access the information array 14. Based on the decoded information, the column decoders 52 select one or more columns of the information array 14 and the operating information of the selected information cells is then provided to the sensing amplifiers 54. Under control of the read control circuit 304, the sensing amplifiers 54 sense and amplify the operating information which is subsequently stored in the data buffers 56. In Step 408, the operating information in the data buffers 56 is transferred to the information register 60 under control of the information register control circuit 310. In Step 410, the address buffer control circuit 302 provides a second address control signal to the address buffer 30 to retrieve the next operating information from the information array 14. The Steps 406, 408 and 410 are repeated until, in Step 412, the address buffer 30 determines the address is the last address of the information array. When it is determined as the last address, the address buffer 30 issues a notifying signal to the power-on main control circuit 308 which in turn issues a reset signal to the power-on detector 306 and thereby ending the initialization operation.

Accordingly, in some examples, a memory system may include a power-on control circuit for controlling a power-on sequence and perform some or all of the steps described above. Additionally, examples consistent with the invention allow a fuse system or fuse array to share some or all common data paths of information, or the same data path circuitry, with a memory array. The arrangement may reduce the areas needed for one or more fuse arrays and make additional areas available for other components or functions of memory devices. Furthermore, additional functions or circuitries, such as program pulse width or device protect circuitries, may be included in memory devices.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A memory device comprising:
   a main array including
      a memory array having a number of memory cells for storing data,
      a number of word lines each coupled to at least one of the memory cells in a corresponding row,
      a number of bit lines each coupled to at least one of the memory cells in a corresponding column, and
      an information array having a number of information cells for storing operating information, wherein each of the information cells is coupled to one of the bit lines;
   a data path circuit coupled to the memory array and the information array via the bit lines, the memory array and the information array being capable of sharing the data path circuit; and
   a control circuit coupled to the data path circuit for controlling operation of the memory array and the information array, wherein the control circuit generates a read control signal when a power-on reset process is completed, so that the data path circuit reads data in the memory cells or the information cells.

2. The memory device of claim 1, further comprising an information register coupled to the data path circuit for storing the operating information read from the information array.

3. The memory device of claim 1, wherein the data path circuit comprises a number of column decoders, sensing amplifiers and data buffers.

4. The memory device of claim 1, wherein the control circuit includes a power-on control circuit for controlling the operation of the information array.

5. The memory device of claim 1, wherein the control circuit includes a power-on control circuit for control of loading operating information to an information register.

6. The memory device of claim 1, further comprising an address buffer coupled to the data path circuit.

7. The memory device of claim 1, wherein the operation of the memory array and the information array includes reading, erasing and programming operations of the memory array and information array.

8. A memory device, comprising:
a main array including
a memory array having a number of memory cells for storing data,
a number of word lines each coupled to at least one of the memory cells in a corresponding row,
a number of bit lines each coupled to at least one of the memory cells in a corresponding column and
an information array having a number of information cells for storing operating information, wherein each of the information cells is coupled to one of the bit lines via the bit lines;
a data path circuit coupled to the main array;
a control circuit coupled to the data path circuit for controlling operation of the memory array and the information array, wherein the control circuit generates a read control signal when a power-on reset process is completed, so that the data path circuit reads data in the memory cells or the information cells; and
an information register coupled to the data path circuit, wherein the information array and the memory array are capable of sharing the data path circuit.

9. The memory device of claim 8, wherein the data path circuit comprises a number of column decoders, sensing amplifiers and data buffers.

10. The memory device of claim 8, wherein the control circuit includes a power-on control circuit for controlling the operation of the information array.

11. The memory device of claim 8, wherein the control circuit includes a power-on control circuit for control of loading operating information to the information register.

12. The memory device of claim 8, further comprising an address buffer coupled to the data path circuit.

13. The memory device of claim 8, wherein the operation of the memory array and the information array includes reading, erase and programming operations of the memory array and information array.

14. The memory device of claim 8, wherein the operation of the memory array and the information array includes reading operation of the information array, during which the operating information is loaded into the information register.

15. A method of operating a memory device, the method comprising:
providing a memory array having a number of memory cells for storing data;
providing an information array having a number of information cells for storing operating information;
sharing a data path circuit between the memory array and the information array via a number of bit lines which are coupled to the memory cells and the information cells; and
providing a control circuit for controlling the operation of the memory array and the information array and generating a read control signal when a power-on reset process is completed, so that the data path circuit reads data in the memory cells or the information cells.

16. The method of claim 15, further comprising providing an information register for storing the operating information read from the information array.

17. The method of claim 15, further comprising providing a power-on control circuit for controlling the operation of the information array.

18. The method of claim 16, further comprising loading the operating information to an information register.

19. The method of claim 18, wherein loading the operating information comprises setting initial address of the information array to be read, reading the operating information from the information array, and transferring the read operating information to the information register through the data path circuit.

20. A memory device comprising:
a main array, comprising:
a number of first word lines;
a number of second word lines;
a number of bit lines;
a memory array, having a number of memory cells for storing data, wherein the memory cells are disposed at each intersection between the first word lines and the bit lines, and each of memory cells is coupled to a corresponding one of the first word lines and a corresponding one of the bit lines; and
an information array, having a number of information cells for storing operating information, wherein the information cells are disposed at each intersection between the second word lines and the bit lines, and each of the information cells is coupled to a corresponding one of the second word lines and a corresponding one of the bit lines;
a data path circuit, coupled to the memory array and the information array via the bit lines, the memory array and the information array being capable of sharing the data path circuit; and
a control circuit, coupled to the data path circuit for controlling operation of the memory array and the information array, wherein the control circuit generates a read control signal when a power-on reset process is completed, so that the data path circuit reads data in the memory cells or the information cells.

* * * * *